(12) United States Patent
Karta et al.

(10) Patent No.: US 7,838,424 B2
(45) Date of Patent: Nov. 23, 2010

(54) ENHANCED RELIABILITY OF WAFER-LEVEL CHIP-SCALE PACKAGING (WLCSP) DIE SEPARATION USING DRY ETCHING

(75) Inventors: Tjandra Winata Karta, Hsinchu (TW); Steven Hsu, Chung-Ho (TW); Chien-Hsiun Lee, Hsin-Chu (TW); Gene Wu, Dayuan Township (TW); Jimmy Liang, Chung-Li (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 717 days.

(21) Appl. No.: 11/773,277

(22) Filed: Jul. 3, 2007

(65) Prior Publication Data
US 2009/0011543 A1 Jan. 8, 2009

(51) Int. Cl.
*H01L 21/302* (2006.01)

(52) U.S. Cl. .................. 438/689; 438/462; 438/113; 438/114; 438/115; 438/464; 257/786; 257/737; 257/738; 257/778; 257/784; 257/780; 257/790; 257/791; 257/730

(58) Field of Classification Search .................... 438/22
See application file for complete search history.

(56) References Cited

U.S. PATENT DOCUMENTS

| | | | | |
|---|---|---|---|---|
| 5,897,337 A * | 4/1999 | Kata et al. | ................... | 438/114 |
| 5,923,995 A * | 7/1999 | Kao et al. | ................... | 438/460 |
| 6,060,373 A * | 5/2000 | Saitoh | ......................... | 438/459 |
| 6,107,164 A * | 8/2000 | Ohuchi | ......................... | 438/465 |
| 6,153,448 A * | 11/2000 | Takahashi et al. | ............ | 438/114 |
| 6,338,980 B1 * | 1/2002 | Satoh | ......................... | 438/106 |
| 6,353,267 B1 * | 3/2002 | Ohuchi et al. | ............... | 257/787 |
| 6,379,999 B1 * | 4/2002 | Tanabe | ....................... | 438/113 |
| 6,534,387 B1 * | 3/2003 | Shinogi et al. | ............... | 438/465 |
| 6,590,257 B2 * | 7/2003 | Ohuchi | ....................... | 257/347 |
| 6,607,970 B1 * | 8/2003 | Wakabayashi | ............... | 438/462 |
| 6,649,445 B1 * | 11/2003 | Qi et al. | ....................... | 438/108 |
| 6,717,245 B1 | 4/2004 | Kinsmann et al. | | |
| 6,777,267 B2 * | 8/2004 | Ruby et al. | .................. | 438/113 |
| 6,805,808 B2 * | 10/2004 | Fujii et al. | ..................... | 216/52 |
| 6,818,475 B2 * | 11/2004 | Yang et al. | .................. | 438/113 |
| 6,908,784 B1 * | 6/2005 | Farnworth et al. | .......... | 438/106 |
| 7,060,531 B2 * | 6/2006 | Arita | .......................... | 438/114 |
| 7,081,665 B2 * | 7/2006 | Wood et al. | .................. | 257/621 |
| 7,115,484 B2 * | 10/2006 | Feng | .......................... | 438/460 |
| 7,135,385 B1 * | 11/2006 | Patwardhan et al. | ........ | 438/464 |
| 7,183,136 B2 * | 2/2007 | Hashimura et al. | .......... | 438/113 |
| 7,183,191 B2 * | 2/2007 | Kinsman et al. | ............ | 438/613 |

(Continued)

*Primary Examiner*—Fernando L. Toledo
*Assistant Examiner*—Ankush K Singal
(74) *Attorney, Agent, or Firm*—Slater & Matsil, L.L.P.

(57) ABSTRACT

An improved Wafer-Level Chip-Scale Packaging (WLCSP) process is described that includes forming a plurality of conductive pillars on a first surface of a semiconductor wafer. One or more grooves are dry etched into the first surface of the semiconductor wafer, where the grooves define at least one boundary between each of a plurality of die within the semiconductor wafer. A layer of encapsulating material is deposited over the first surface. A recess is then cut in each of the grooves through the encapsulating material, where the cutting leaves a piece of semiconductor material on the second surface of the semiconductor wafer. The second surface is then ground to remove the piece of semiconductor material, where the removal of this material separates the plurality of die.

20 Claims, 3 Drawing Sheets

U.S. PATENT DOCUMENTS

| | | | | |
|---|---|---|---|---|
| 7,221,059 B2 * | 5/2007 | Farnworth et al. | | 257/778 |
| 7,276,783 B2 * | 10/2007 | Goller et al. | | 257/678 |
| 7,352,063 B2 * | 4/2008 | Noguchi | | 257/707 |
| 7,382,060 B2 * | 6/2008 | Farnworth et al. | | 257/792 |
| 7,413,927 B1 * | 8/2008 | Patwardhan et al. | | 438/108 |
| 7,417,325 B2 * | 8/2008 | Farnworth et al. | | 257/780 |
| 7,417,330 B2 * | 8/2008 | Wakabayashi et al. | | 257/790 |
| 7,432,604 B2 * | 10/2008 | Farnworth et al. | | 257/792 |
| 7,473,582 B2 * | 1/2009 | Wood et al. | | 438/113 |
| 7,482,702 B2 * | 1/2009 | Farnworth et al. | | 257/790 |
| 7,598,154 B2 * | 10/2009 | Izumi | | 438/462 |
| 7,626,269 B2 * | 12/2009 | Oliver et al. | | 257/774 |
| 7,727,875 B2 * | 6/2010 | Shin et al. | | 438/613 |
| 2003/0143819 A1 * | 7/2003 | Hedler et al. | | 438/462 |
| 2003/0162328 A1 * | 8/2003 | Ohuchi et al. | | 438/113 |
| 2005/0032334 A1 * | 2/2005 | Shibata | | 438/462 |
| 2005/0202651 A1 * | 9/2005 | Akram | | 438/463 |
| 2006/0079024 A1 * | 4/2006 | Akram | | 438/110 |
| 2006/0079025 A1 * | 4/2006 | Kripesh et al. | | 438/113 |
| 2006/0205182 A1 * | 9/2006 | Soejima | | 438/460 |
| 2006/0284285 A1 * | 12/2006 | Fukazawa | | 257/618 |
| 2007/0148827 A1 * | 6/2007 | Kojima | | 438/125 |
| 2007/0184654 A1 * | 8/2007 | Akram et al. | | 438/675 |
| 2007/0291440 A1 * | 12/2007 | Dueber et al. | | 361/301.3 |
| 2008/0164573 A1 * | 7/2008 | Basker et al. | | 257/621 |
| 2009/0001495 A1 * | 1/2009 | Weng et al. | | 257/433 |

* cited by examiner

ENHANCED RELIABILITY OF WAFER-LEVEL CHIP-SCALE PACKAGING (WLCSP) DIE SEPARATION USING DRY ETCHING

TECHNICAL FIELD

The present invention relates generally to wafer level chip scale packaging (WLCSP), and more particularly to enhancing the reliability of die separation in WLCSP wafers through dry etching.

BACKGROUND

The past few decades have seen many shifts in electronics and semiconductor packaging that have impacted the entire semiconductor industry. The introduction of surface-mount technology (SMT), such as ball grid array (BGA), land grid array (LGA), and similar types of packages, were generally important steps for high-throughput assembly of a wide variety of integrated circuit (IC) devices, while, at the same time, allowing reduction of the pad pitch on the printed circuit board. Conventionally packaged ICs have a structure basically interconnected by fine gold wire between metal pads on the die and electrodes spreading out of molded resin packages. Dual Inline Package (DIP) and Quad Flat Package (QFP) are fundamental structures of current IC packaging. However, increased pin count peripherally designed and arranged around the package typically results in too short of a pitch of lead wire, yielding limitations in board mounting of the packaged chip.

Chip-scale or chip-size packaging (CSP), BGA, LGA, and the like are just some of the solutions that enable dense electrode arrangement without greatly increasing the package size. CSP provides for wafer packaging on a chip-size scale. CSP typically results in packages within 1.2 times the die size, which greatly reduces the potential size of devices made with the CSP material. Although these advances have allowed for miniaturization in electronic devices, the ever-demanding trend toward even smaller, lighter, and thinner consumer products have prompted even further attempts at package miniaturization.

To fulfill market demands toward increased miniaturization and functionality, WLCSP has been introduced in recent years for generally increasing density, performance, and cost-effectiveness, while decreasing the weight and size of the devices in the electronic packaging industry. In WLCSP, the packaging is typically generated directly on the die with contacts provided by BGA, bump electrodes, LGA, and the like. Recent advanced electronic devices, such as mobile phones, mobile computers, camcorders, personal digital assistants (PDAs), and the like, utilize compact, light, thin, and very densely packaged ICs. Using WLCSP for packaging smaller die size devices with lower numbers of pins, corresponding to larger number of chips on one wafer, is, therefore, usually advantageous and cost-effective.

During the typical manufacturing process, a silicon wafer is processed to include many separate dies on the same wafer. Once the processing of the circuitry and packaging features has been finished, die saws cut the wafer to separate each die. During this process, a wafer with up to thousands of circuits is cut into individual pieces, each called a die. In between the functional parts of the circuits, a thin non-functional spacing, called the scribe, is generally provided, where a saw can safely cut the wafer without damaging the circuit. The width of the scribe is typically very small, usually around 100 µm. Usually the dicing is performed with a highly-accurate water-cooled circular saw having diamond-tipped teeth.

One disadvantage of the prior art is that the wafer may sometimes crack or splay at the die edge, thus, diminishing the integrity and reliability of the integrated circuit (IC) chip. Faulty die diminish the return on investment to the semiconductor manufacturers and, thus, raises the costs for each individual IC die. In some applications, a die saw groove is often created by a laser within the boundary regions of the wafer in order to make the scribe area less prone to cracking or splaying during the cutting process. However, while the laser-cut die saw groove lowers the chance of splaying or cracking, such damage continues to be an occurrence.

One method for separating or singulating the individual die regions on a wafer is described in U.S. Pat. No. 6,717,245 to Kinsman, et al. (hereinafter Kinsman). Kinsman describes a process in which a die saw or wet etching cuts channels between the individual die down through an active layer of the wafer. These channels are then filled with an encapsulating material that forms a hermetical seal around the active regions of each die. Another die saw is then used to cut through each channel to separate or singulate each die. The encapsulating material assists in preventing splaying or cracking of the wafer, although such damage generally continues simply by virtue of the operation of the die saw on the wafer.

In CSP, an encapsulating layer of some type of resin or polymer typically seals the wafer, including the die saw grooves. Another method of die cutting CSP wafers is described in U.S. Pat. No. 6,107,164, to Ohuchi (hereinafter Ohuchi). In Ohuchi, a diamond blade saw is used to cut grooves into the wafer. Ohuchi teaches that the grooves are preferably cut to a depth of about two-thirds the depth of the wafer. Thereafter the encapsulating layer is applied. The encapsulating layer, thus, fills the grooves. In the separation process, Ohuchi describes that the back of the wafer is polished to remove the silicon and reveal the grooves filled with the encapsulating material. After the backside has been thinned, a narrow blade is used to cut the wafer at the exposed grooves. Again, the addition of the encapsulating layer to the saw grooves assists in preventing some damage to the die caused by the wafer saws. However, damage continues because the wafer saws still operate to separate or singulate the die from the wafer.

SUMMARY OF THE INVENTION

These and other problems are generally solved or circumvented, and technical advantages are generally achieved, by preferred embodiments of the present invention that dry etch smooth-walled grooves into a wafer to define the various die boundaries. An encapsulating layer is deposited onto the front-side of the semiconductor wafer. The encapsulating layer seals and protects the active elements of the die and also seals and protects any conducting pillars or posts that are formed on the front-side of the wafer.

After planarizing the encapsulating layer to expose access to the conducting pillars or posts, a die saw cuts through the encapsulant at the groove locations leaving a small portion or piece of the semiconductor substrate on the backside of the wafer. The individual die are then separated or singulated by grinding or polishing the backside to remove the semiconductor substrate material at the bottom of the grooves.

In accordance with a preferred embodiment of the present invention, a method for providing WLCSP includes forming a plurality of conductive pillars on a first surface of a semiconductor wafer. One or more grooves are dry etched into the first surface of the semiconductor wafer, where the grooves define at least one boundary between each of a plurality of die within the semiconductor wafer. A layer of encapsulating material is deposited over the first surface. A recess is then cut in each of the grooves through the encapsulating material, where the cutting leaves a piece of semiconductor material on the second surface of the semiconductor wafer. The second surface is then ground to remove the piece of semiconductor material, where the removal of this material separates the plurality of die.

In accordance with another preferred embodiment of the present invention, a method for providing WLCSP includes forming a plurality of conducting posts on a front-side of a semiconductor wafer. A plurality of grooves is then formed in the front-side using a dry etchant. The front-side is coated with an encapsulant layer, after which a plurality of channels is then sawed into the semiconductor wafer to a predetermined depth in the grooves. The backside of the semiconductor wafer is polished in order to remove any semiconductor material at the grooves which separates the die formed in the semiconductor wafer.

In accordance with another preferred embodiment of the present invention, a method for enhancing a reliability of wafer-level chip-scale packaging (WLCSP) includes creating a plurality of wafer-level contacts on a front-side surface of a semiconductor wafer. A plurality of grooves is dry etched onto the front-side surface, where the grooves define one or more boundaries between each of a plurality of die within the semiconductor wafer. The front-side surface is then sealed with an encapsulating material. A die saw saws through the encapsulating material at the grooves, where the sawing leaves a piece of substrate material on the backside of the semiconductor wafer. Each of the plurality of die is separated by polishing the backside to remove the piece of substrate material.

An advantage of a preferred embodiment of the present invention is that by using dry etching, which is typically more expensive that the commonly-used wet etching techniques, smoother sidewalls result in the grooves. The smoother surface lowers the risk of cracking or splaying than the risk present in the rougher-edged walls created by wet etching, dicing, or laser grooving.

A further advantage of a preferred embodiment of the present invention is that the quality of the separated die is improved by sawing the recesses into the wafer before the backside grinding or polishing separates the individual die. When the die are separated or singulated directly from a sawing/dicing process, the chances of cracking or splaying are increased, especially with narrow dicing streets of 60 μm or less.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon wafer implementing WLCSP using copper posts. The invention may also be applied, however, to other wafer and process materials.

Figure 1A:
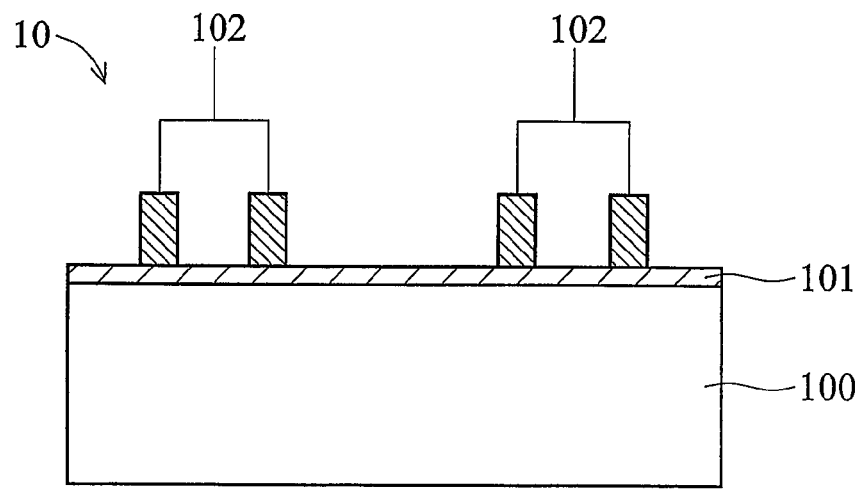
FIG. 1A is a cross-sectional view of a portion of a semiconductor wafer at an early stage in implementing a WLCSP process according to one embodiment of the present invention.

With reference now to FIG. 1A, there is shown a cross-sectional view of wafer portion 10 at an early stage in implementing a WLCSP process according to one embodiment of the present invention. Wafer portion 10 is only a small part of a larger wafer used in fabricating semiconductor IC devices. Wafer portion 10 includes silicon substrate 100 and insulating layer 101, which acts as a passivation layer to the IC device. As part of the WLCSP, copper pillars 102 are formed on top of wafer portion 10. Copper pillars 102 provide electrical connection to the active portions of the IC devices fabricated within wafer portion 10.

It should be noted that in additional and/or alternative embodiments of the present invention, the wafer-level contacts, including conducting pillars or posts, such as copper pillars 102, may be formed using other conductive material, such as aluminum, gold, a conducting alloy, or the like. The specific use of copper in the disclosed embodiment is not intended to limit the material used.

Figure 1B:
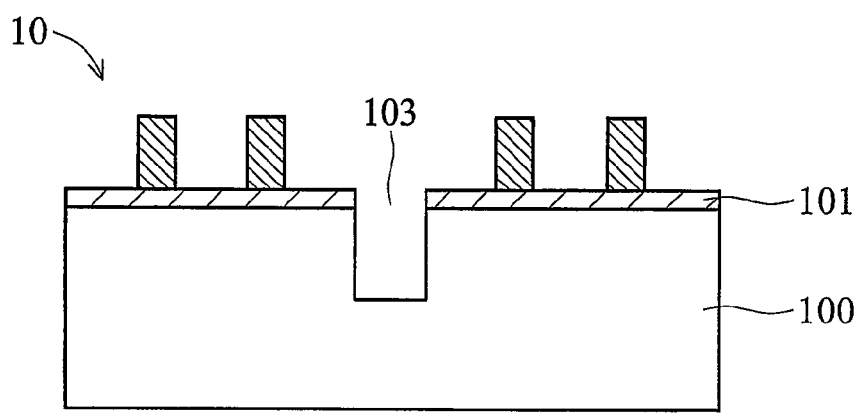
FIG. 1B is a cross-sectional view of a portion of a semiconductor wafer during WLCSP processing according to one embodiment of the present invention.

FIG. 1B is a cross-sectional view of wafer portion 10 during WLCSP processing according to one embodiment of the present invention. Using a dry etchant, die groove 103 is formed in wafer portion 10. Die groove 103 defines part of a die boundary on the semiconductor wafer. A dry etchant is selected because it produces a much smoother sidewall to die groove 103. A smoother sidewall reduces the risk of cracking or splaying when die cutting occurs in comparison to existing techniques for dicing or laser grooving.

Various methods and chemicals/gases may be used for dry etching die groove 103, such as ion mill etching, plasma sputtering, plasma etching, reactive ion etching, and the like. Gases such as $CF_4$, $SF_6$, $CHF_3+O_2$, $CF_4+H_2$, $Cl_2$, $Cl_2+BCl_3$, and the like may be used.

In preferred embodiments of the present invention, the die grooves, such as die groove 103, are etched to a depth of between 100-150 μm with a width of around 60 μm.

Figure 1C:
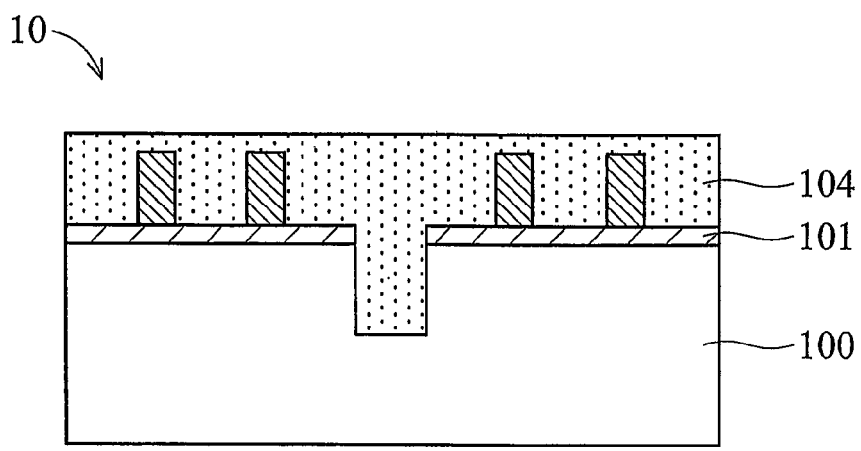
FIG. 1C is a cross-sectional view of a portion of a semiconductor wafer during WLCSP processing according to one embodiment of the present invention.

FIG. 1C is a cross-sectional view of wafer portion 10 during WLCSP processing according to one embodiment of the present invention. Encapsulating layer 104 is deposited onto wafer portion 10. Encapsulating layer 104 overlies copper pillars 102, insulating layer 101 and substrate 100. It provides a beneficial seal to the packaging of any IC devices that are ultimately produced from the wafer. In order to expose the contact points of copper pillars 102, encapsulating layer 104 is planarized, through a process such as chemical mechanical planarization/polishing (CMP), or the like. This planarization removes portions of encapsulating layer 104 to expose the ends of copper pillars 102 and also results in a flat surface to wafer portion 10.

It should be noted that in various embodiments of the present invention, different types of material may be used for encapsulating layer 104. Materials such as epoxy, resin, and the like may be coated, printed, or depressed onto the frontside surface of the wafer. Additionally, such materials may be organic.

Figure 1D:
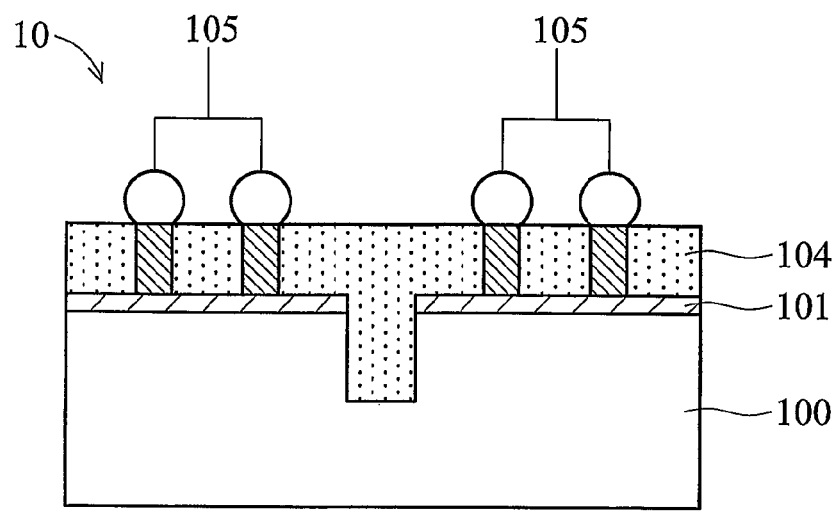
FIG. 1D is a cross-sectional view of a portion of a semiconductor wafer during WLCSP processing according to one embodiment of the present invention.

FIG. 1D is a cross-sectional view of wafer portion 10 during WLCSP processing according to one embodiment of the present invention. WLCSP processing provides external contacts to the IC device through a number of contact types, such as solder balls, lands, and the like. FIG. 1D illustrates formation of solder balls 105 onto the exposed contacts to copper pillars 102. Solder balls 105 may therefore provide an electrical connection between a point external to the IC device and the IC device through copper pillars 102.

It should be noted that various conductor methods may be used to provide the external connection to the IC devices through copper pillars 102. Connection elements, such as pins, posts, lands, and the like, may be fabricated instead of solder balls 105 to provide wafer-level chip packaging. The present invention is not limited only to using solder balls 105, as shown in FIG. 1D.

Figure 1E:
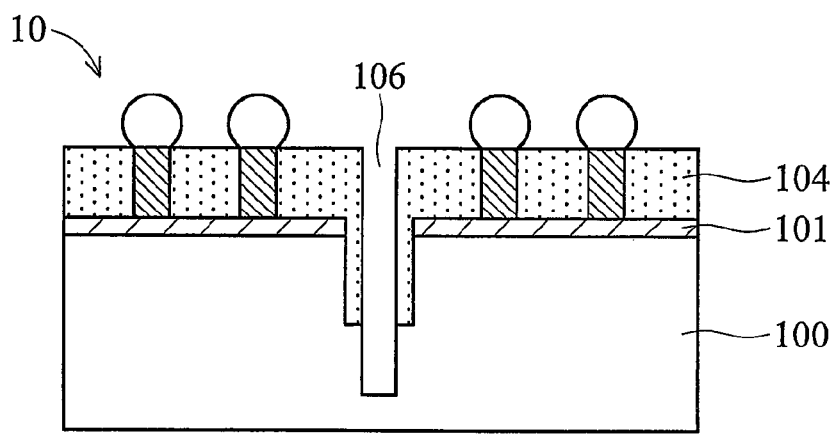
FIG. 1E is a cross-sectional view of a portion of a semiconductor wafer during WLCSP processing according to one embodiment of the present invention.

FIG. 1E is a cross-sectional view of wafer portion 10 during WLCSP processing according to one embodiment of the present invention. When die separation begins, wafer saw 106 cuts a 50 μm wide recess into the wafer at die groove 103. Wafer saw 106 cuts through encapsulating layer 104 and cuts into substrate 100 of wafer portion 10. Instead of cutting all the way through wafer portion 10, wafer saw 106 stops short, leaving a small piece or amount of substrate material across the wafer. The remaining amount of substrate material is preferably sufficient to hold the wafer together as a single unit that may be moved by traditional wafer fabrication transport machinery. One example thickness of such a piece is 100 μm.

It should be noted that the recesses or channel cut through the wafer grooves may be cut at various different widths depending on the desired feature size of the die. The various embodiments of the present invention preferably allow for recess or channel widths of less than 60 μm.

Figure 1F:
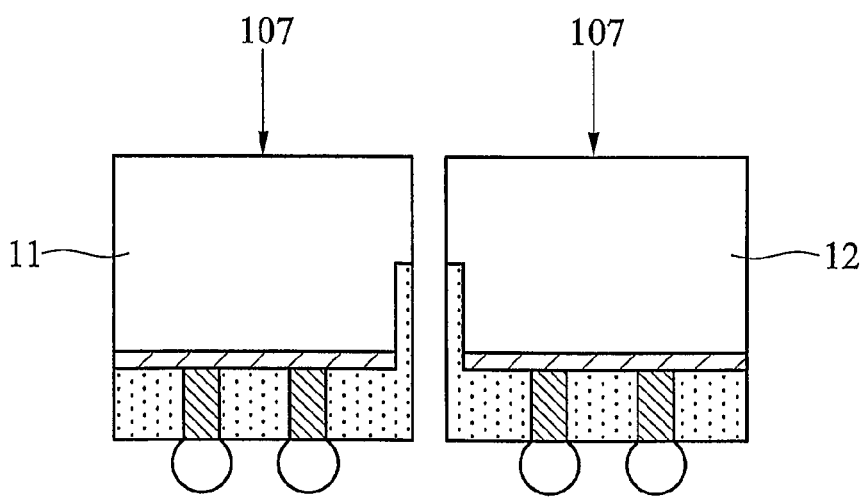
FIG. 1F is a cross-sectional view of singulated die formed after WLCSP processing according to one embodiment of the present invention.

FIG. 1F is a cross-sectional view of singulated die 11 and 12 formed after WLCSP processing according to one embodiment of the present invention. After die saw 106 (FIG. 1E) cuts a recess into the wafer, a grinding process, such as CMP or the like, is applied to backside 107. The grinding process removes the remaining substrate material which separates each of the die fabricated within the wafer. By cutting to a specific depth in wafer portion 10 and then grinding the remaining substrate from backside 107, the resulting die, die 11 and 12, experience less cracking, splaying, and the like. This process thus results in a more reliable semiconductor IC device.

Figure 2:
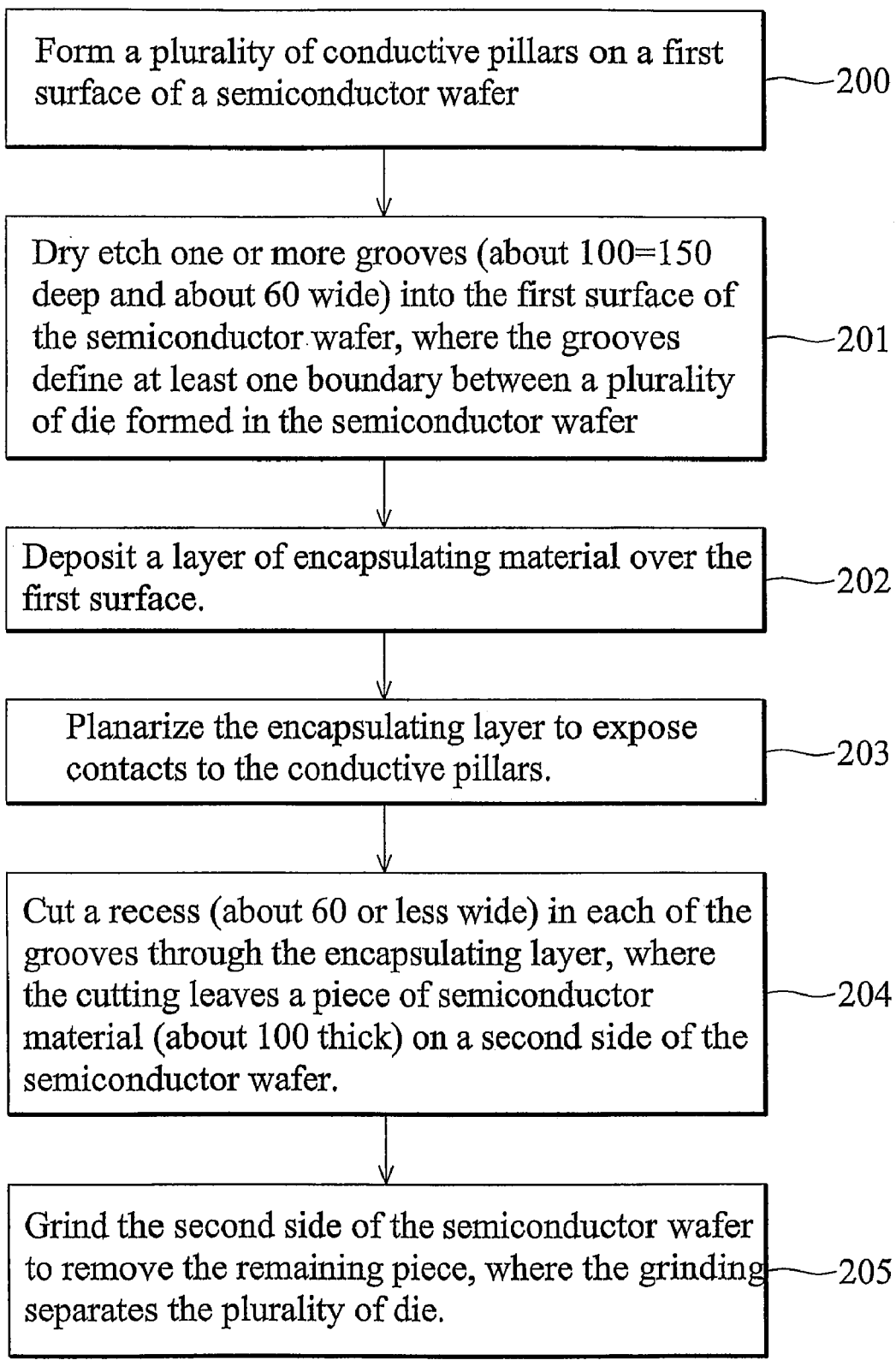
FIG. 2 is a flowchart illustrating example steps executed to implement a WLCSP process according to one embodiment of the present invention.

FIG. 2 is a flowchart illustrating example steps executed to implement a WLCSP process according to one embodiment of the present invention. In step 200, a plurality of conductive pillars is formed on a first surface of a semiconductor wafer. One or more grooves (about 100-150 μm deep and about 60 μm wide) are dry etched, in step 201, into the first surface of the semiconductor wafer, where the grooves define at least one boundary between a plurality of die formed in the semiconductor wafer. A layer of encapsulating material is deposited over the first surface in step 202. The encapsulating layer is planarized, in step 203, to expose contacts to the conductive pillars. In step 204, a recess (about 60 μm or less wide) is cut in each of the grooves through the encapsulating layer, where the cutting leaves a piece of semiconductor material (about 100 μm thick) on a second side of the semiconductor wafer. The second side of the semiconductor wafer is ground, in step 205, to remove the remaining piece, where the grinding separates the plurality of die.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
    forming a plurality of conductive pillars on a first surface of a semiconductor wafer;
    dry etching one or more grooves in said first surface of said semiconductor wafer, wherein said one or more grooves define at least one boundary between a plurality of die within said semiconductor wafer;
    depositing a layer of encapsulating material over said first surface;
    cutting a recess in each of said one or more grooves through said layer of encapsulating material, wherein said cutting cuts said semiconductor wafer incompletely and leaves part of said semiconductor wafer on a second side of said semiconductor wafer; and
    grinding said second side to remove part of said semiconductor wafer, wherein said grinding separates said plurality of die.

2. The method of claim 1 further comprising:
    planarizing said layer to expose contacts to said plurality of conductive pillars.

3. The method of claim 1 wherein said one or more grooves has a depth within a range of 100 μm to 150 μm.

4. The method of claim 1 wherein said one or more grooves has a width of about 60 μm.

5. The method of claim 1 wherein said piece of semiconductor material has a thickness of about 100 μm.

6. The method of claim 1 wherein said recess has a width of 60 μm or less.

7. The method of claim 1 wherein said encapsulating material comprises an organic material.

8. The method of claim 1 wherein said dry etching comprises one of:
    ion mill etching;
    plasma sputtering;
    plasma etching; and
    reactive ion etching.

9. A method comprising:
forming a plurality of conducting posts on a front-side of a semiconductor wafer;
forming a plurality of grooves in said front-side using a dry etchant;
coating said front-side with an encapsulant layer;
sawing a plurality of channels to a depth below said plurality of grooves; and
polishing a backside of said semiconductor wafer to said plurality of channels in order to separate a plurality of die formed in said semiconductor wafer.

10. The method of claim 9 further comprising:
planarizing said encapsulant layer to expose contact to said plurality of conducting posts.

11. The method of claim 9 wherein said plurality of grooves has a depth within a range of 100 μm to 150 μm and a width of about 60 μm.

12. The method of claim 9 wherein a distance from a bottom of said plurality of channels to said backside is about 100 μm.

13. The method of claim 9 wherein said plurality of channels has a width of 60 μm or less.

14. The method of claim 9 wherein said encapsulant layer is formed from an organic material.

15. The method of claim 9 wherein said forming said plurality of grooves comprises one of:
ion mill etching;
plasma sputtering;
plasma etching; and
reactive ion etching.

16. A method for enhancing reliability of wafer-level chip-scale packaging (WLCSP), said method comprising:
creating a plurality of wafer-level contacts on a front-side surface of a semiconductor wafer;
dry etching a plurality of grooves on said front-side surface, said plurality of grooves defining one or more boundaries between a plurality of die within said semiconductor wafer;
sealing said front-side surface with an encapsulating material;
sawing through said encapsulating material at said plurality of grooves, said sawing proceeding only partially through said semiconductor wafer; and
separating each of said plurality of die by polishing said backside to remove only partial portion of said semiconductor wafer.

17. The method of claim 16 further comprising:
planarizing said encapsulating material to expose contact to said plurality of wafer-level contacts.

18. The method of claim 16 wherein said plurality of grooves has a depth within a range of 100 μm to 150 μm and a width of about 60 μm.

19. The method of claim 16 wherein said dry etching comprises one of:
ion mill etching;
plasma sputtering;
plasma etching; and
reactive ion etching.

20. The method of claim 16 wherein said encapsulating material comprises an organic material.

* * * * *